(12) United States Patent
Galera et al.

(10) Patent No.: US 7,923,847 B2
(45) Date of Patent: Apr. 12, 2011

(54) SEMICONDUCTOR SYSTEM-IN-A-PACKAGE CONTAINING MICRO-LAYERED LEAD FRAME

(75) Inventors: Manolito Galera, Singapore (SG); Leocadio Morona Alabin, Singapore (SG)

(73) Assignee: Fairchild Semiconductor Corporation CA (US)

( * ) Notice: Subject to any disclaimer, the term of this patent is extended or adjusted under 35 U.S.C. 154(b) by 236 days.

(21) Appl. No.: 12/334,267

(22) Filed: Dec. 12, 2008

(65) Prior Publication Data
US 2010/0052121 A1  Mar. 4, 2010

Related U.S. Application Data

(63) Continuation-in-part of application No. 12/199,065, filed on Aug. 27, 2008.

(51) Int. Cl.
*H01L 23/48* (2006.01)
(52) U.S. Cl. ........ 257/777; 257/686; 257/690; 257/724; 257/773; 257/776; 257/780; 257/786; 257/E25.006; 257/E25.013; 257/E25.021; 257/E25.027; 257/E23.015; 257/E23.02; 257/E23.085
(58) Field of Classification Search ............ 257/723, 257/724, 738, 772, 779–784, 786, 924, 664–677, 257/688–700, E23.001–E23.194, 41, 81, 257/82, 91, 99, 177–182, 276, 457, 459, 257/502, 503, 573, 584, 602, 621, 686, 777, 257/E25.006, E25.013, E25.018, E25.021, 257/E25.027, E23.085; 438/88, 98, 100, 438/101, 111, 112, 123, 124, 411, 412, 461, 438/584, 597–688, FOR. 340, FOR. 417, 438/109, FOR. 366, FOR. 367, FOR. 368, 438/FOR. 377, FOR. 380, FOR. 426
See application file for complete search history.

(56) References Cited

U.S. PATENT DOCUMENTS

| | | | | |
|---|---|---|---|---|
| 6,448,639 B1 * | 9/2002 | Ma | ............... | 257/691 |
| 6,734,555 B2 * | 5/2004 | Boireau | .............. | 257/734 |
| 6,747,362 B2 * | 6/2004 | Barrow | ............... | 257/786 |
| 7,163,842 B2 * | 1/2007 | Karnezos | ............ | 438/108 |
| 7,446,398 B2 * | 11/2008 | Niu et al. | ............... | 257/668 |
| 7,449,364 B2 * | 11/2008 | Lyne | ............... | 438/106 |
| 7,855,448 B2 * | 12/2010 | Seaman et al. | ....... | 257/692 |

OTHER PUBLICATIONS

U.S. Appl. No. 12/199,065, filed Aug. 27, 2008.
U.S. Appl. No. 12/332,207, filed Dec. 10, 2008.

\* cited by examiner

*Primary Examiner* — Jasmine J Clark
(74) *Attorney, Agent, or Firm* — Kirton & McConkie; Kenneth E. Horton (57) ABSTRACT

Semiconductor packages that contain a system-in-a-package and methods for making such packages are described. The semiconductor packages contain a first semiconductor die resting on a middle of a land pad array, a second die disposed over the first die and resting on routing leads that are connected to the land pad array, a third die resting on the backside of the second die and connected to the land pad array by wire bonds, and a passive device and/or a discrete device resting on device pads. The packages also contain thermal pads which operate as a heat sink. The land pad array is formed from etching the leadframe. The semiconductor packages have a full land pad array with a thin package size while having a system-in-a-package design. Other embodiments are also described.

25 Claims, 6 Drawing Sheets

SEMICONDUCTOR SYSTEM-IN-A-PACKAGE CONTAINING MICRO-LAYERED LEAD FRAME

CROSS-REFERENCE TO RELATED APPLICATION

This patent application is a continuation-in-part of U.S. application Ser. No. 12/199,065, filed Aug. 27, 2008, the entire disclosure of which is hereby incorporated by reference.

FIELD

This application relates generally to semiconductor devices and methods for making such devices. More specifically, this application describes semiconductor packages that contain a system-in-a-package (SIP) and methods for making such semiconductor packages.

BACKGROUND

Semiconductor packages are well known in the art. Often, these packages may include one or more semiconductor devices, such as an integrated circuit ("IC") die or chip, which may be connected to a die pad that is centrally formed in a lead frame which contain a series of leads. In some cases, bond wires electrically connect the IC die to a series of terminals that serve as an electrical connection to an external device, such as a printed circuit board ("PCB"). An encapsulating material can be used to cover the bond wires, the IC die, the terminals, and/or other components of the semiconductor device to form the exterior of the semiconductor package. A portion of the terminals and possibly a portion of the die pad may be externally exposed from the encapsulating material. In this manner, the die may be protected from environmental hazards—such as moisture, contaminants, corrosion, and mechanical shock—while being electrically and mechanically connected to an intended device that is external to the semiconductor package.

After it has been formed, the semiconductor package is often used in an ever growing variety of electronic applications, such as disk drives, USB controllers, portable computer devices, cellular phones, and so forth. Depending on the die and the electronic application, the semiconductor package may be highly miniaturized and may need to be as small as possible.

SUMMARY

This application relates to semiconductor packages that contain a system-in-a-package and methods for making such packages. The semiconductor packages contain a first semiconductor die resting on a middle of a land pad array, a second die disposed over the first die and resting on routing leads that are connected to the land pad array, a third die resting on the backside of the second die and connected to the land pad array by wire bonds, and a passive device and/or a discrete device resting on device pads. The packages also contain thermal pads which operate as a heat sink. The land pad array is formed from etching the leadframe. The semiconductor packages have a full land pad array with a thin package size while having a system-in-a-package design.

BRIEF DESCRIPTION OF THE DRAWINGS

The following description can be better understood in light of the Figures, in which.

The Figures illustrate specific aspects of the semiconductor packages and methods for making such packages. Together with the following description, the Figures demonstrate and explain the principles of the methods and structures produced through these methods. In the drawings, the thickness of layers and regions are exaggerated for clarity. It will also be understood that when a layer, component, or substrate is referred to as being "on" another layer, component, or substrate, it can be directly on the other layer, component, or substrate, or intervening layers may also be present. The same reference numerals in different drawings represent the same element, and thus their descriptions will not be repeated.

DETAILED DESCRIPTION

The following description supplies specific details in order to provide a thorough understanding. Nevertheless, the skilled artisan would understand that the devices and associated methods of making and using the devices can be implemented and used without employing these specific details. Indeed, the devices and associated methods can be placed into practice by modifying the illustrated devices and associated methods and can be used in conjunction with any other apparatus and techniques conventionally used in the industry. For example, while the description below focuses on methods for making for semiconductor packages in the IC industry, it could be used in and applied to other electronic devices like optoelectronic devices, solar cells, MEMS structures, lighting controls, power supplies, and amplifiers.

Some embodiments of the semiconductor packages and methods for making such packages are shown in the Figures. In these embodiments, the methods for making the semiconductor packages begin by providing a leadframe 10. The leadframe supports a die (or dies) that will be placed thereon, serves as part of the input/output (I/O) interconnection system, and also provides a thermally conductive path for dissipating some of the heat generated during operation. The material of the leadframe 10 can comprise any conductive metal or metal alloy known in the art, including Cu, Ni—Pd, Fe, Fe alloy, Ni—Pd—Au, Ni—Pd—Au/Ag, or combinations thereof. In some embodiments, the leadframe comprises Cu with selective Ag plating or Ni—Pd—Au or Ni—Pd—Au/Ag pre-plating.

Figure 1:
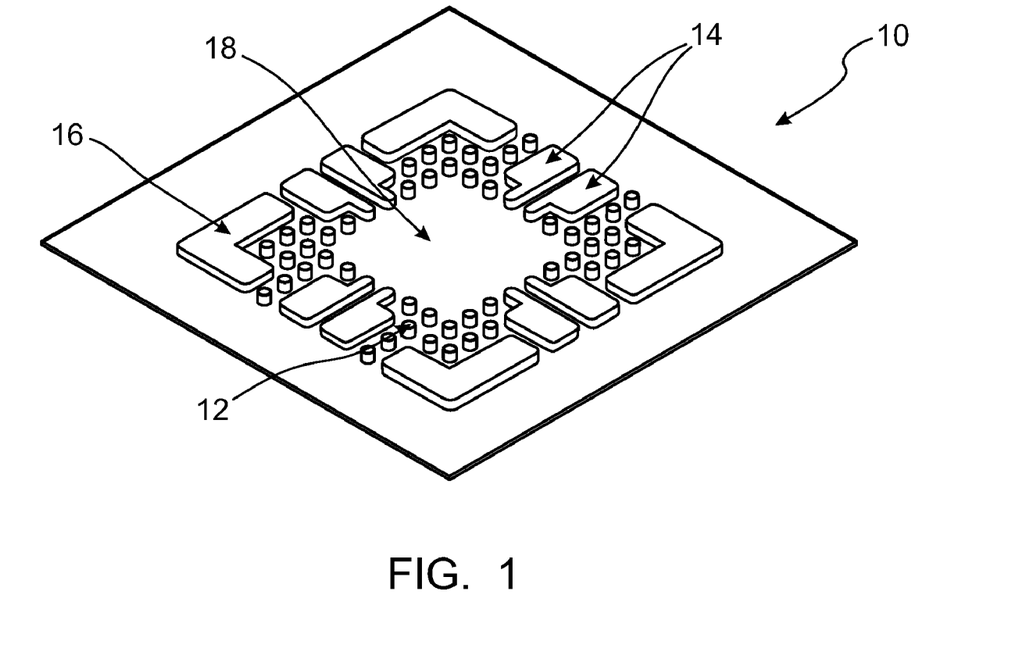
FIG. 1 shows some embodiments of a method for making semiconductor packages containing a lead frame with vias and pads.

In some instances, the leadframe 10 can contain a layer of metal plating (not shown) if desired. For example, the leadframe (or lead frame) 10 may be electroplated or otherwise coated with a layer of a solderable conductive material, such as tin, gold, lead, silver, and/or another solderable material. In some embodiments, the leadframe 10 can have one or more recesses that define a die pad (or die attach pad) that supports a semiconductor die. For example, as shown in FIG. 1, the leadframe 10 contains an upper surface with a recess that operates as a die attach pad 18 and which is sized and shaped to allow the desired semiconductor die to be disposed thereon.

Next, vias 12 can be provided on the upper surface of the lead frame 10 if the leadframe is not made with vias 12 already present. The vias 12 can be formed on the lead frame 10 using any known technique in the art, including any known masking and etching process which removes the material of the lead frame 10 where the vias 12 do not need to be present. In some instances, the vias 12 are formed while the lead frame 10 is being manufactured. The thickness of the vias 12 will depend on the leadframe thickness, and in some configurations the vias can have half of the thickness of the leadframe. In some embodiments, the vias 12 can have a thickness ranging from about 50 μm to about 100 μm.

Pads 14 and 16 can be provided on the upper surface of the lead frame 10 if the leadframe is not made with them already present. The pads 14 and 16 can be formed on the lead frame 10 using any known technique in the art, including any known masking and etching process which removes the material of the lead frame 10 where the pads will not be located. In some instances, the pads 14 and 16 are formed while the lead frame 10 is being manufactured. The thickness of the pads 14 and 16 will also depend on the leadframe thickness, and in some configurations the pads can have a thickness substantially similar to the vias. In some embodiments, the pads 14 and 16 can have a thickness ranging from about 50 Mm to about 100 μm.

The pads can comprise both device pads 14 and thermal pads 16. The device pad(s) 14 will support a discrete semiconductor device and/or a passive semiconductor device in the completed semiconductor package. Accordingly, the device pad(s) 14 will be configured with a size and shape that will support the desired discrete semiconductor device or passive semiconductor device. In the embodiments depicted in the Figures, the device pads 14 can have a substantially rectangular shape with a protrusion extending towards the middle of the lead frame 10. The protrusion operates to connect to the discrete or passive device to a specific via in the package. The semiconductor package can contain one device pad or multiple device pads (as illustrated in the Figures).

The thermal pad(s) 16 are located near the perimeter of the completed semiconductor package. In some embodiments, such as those depicted in the Figures, the thermal pads 16 can be located in the corners of the package. The thermal pads 16 can operate as a heat sink for the semiconductor package. Accordingly, the thermal pads 16 can be given a shape and size consistent with these functions. In the illustrated embodiments, the thermal pads can be given a substantially "L" shaped configuration because this configuration provides a larger area for better thermal dissipation. The semiconductor package can contain one thermal pad or multiple thermal pads (as illustrated in the Figures).

Figure 2:
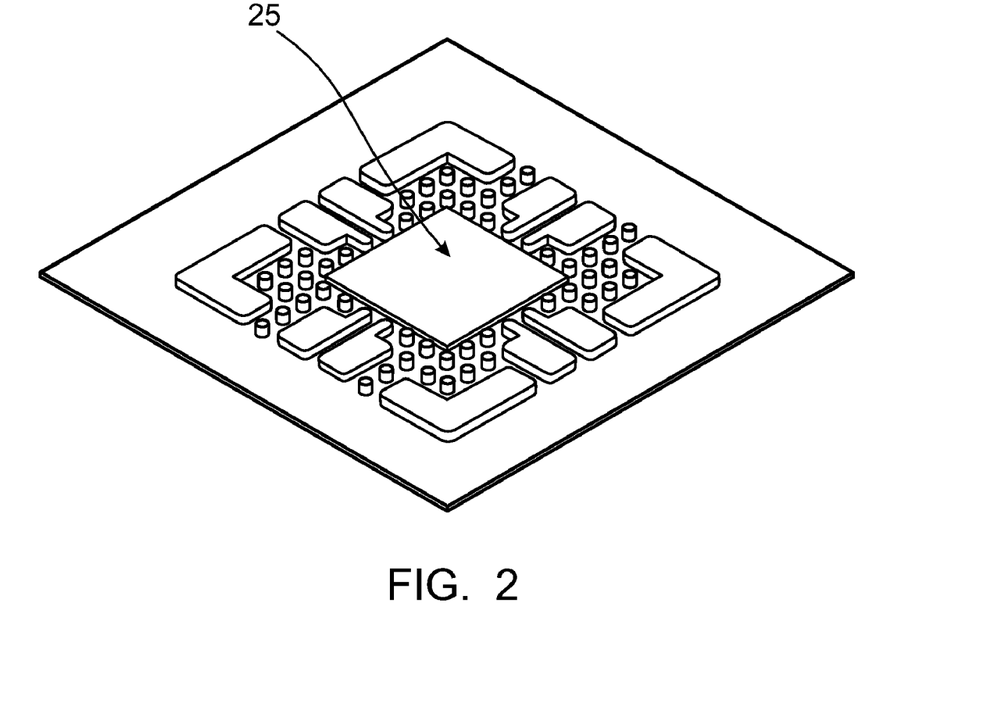
FIG. 2 depicts some embodiments of a method for making semiconductor packages containing a first semiconductor die.

Next, as shown in FIG. 2, a first semiconductor die 25 (or die) containing an IC device is disposed on the DAP 18. The die 25 may be made of any suitable semiconductor material. Some non-limiting examples of such materials may include silicon, gallium arsenide, silicon carbide, gallium nitride, silicon and germanium, and combinations thereof.

The die 25 can contain any number of IC devices. The IC device may contain any known integrated circuit in the art. Some non-limiting examples of these devices may include audio amplifier, LDO, logic driver, signal switch, comparators, or combinations thereof.

Any known flipchip process can be used to attach the first die 25 to the DAP 18. In these embodiments, the IC device(s) on the first die 25 can be provided with a bond pad as known in the art. In some embodiments, the bond pads can be provided in those areas that overlay the IC device(s). The bond pads can be formed in the desired location by any process known in the art (such as a redistribution method) and can be made of any known solderable material, including Au, Cu, Ag, Ti, Ni, Sn, W, Ni, or combinations thereof. The bond pads are deposited with bumps such as stud bump, solder ball, or Cu pillar and can have any height that allows molding compound to flow in. In some embodiments, the height of the bond pads can range from about 60 to about 100 μm. In other embodiments, the height of the bumped bond pads can be about 75 μm.

Next, bumps can be provided on the bond pads. The bumps can be made of any solderable material such as Au, solder, or Cu or combinations thereof. The bumps can be provided on the bond pads through any bumping process known in the art, including ball drop, printing, and electroless plating. Then, the die 25 is flipped and placed on the DAP 18 so the bond pads (through the bump) becomes attached to the desired locations of the leadframe, as shown in FIG. 2.

In some embodiments, the DAP 18 can be altered prior to the first die 25 being attached to it. In these embodiments, a solder mask (or resist) layer could be formed on the DAP 18. Alternatively, solder-confining features like etched cavities or protrusions could be formed on the DAP 18. The solder mask and solder-confining features can be used to aid in the attachment process because they are aligned with the bond pads formed on the first die 25.

Figure 3:
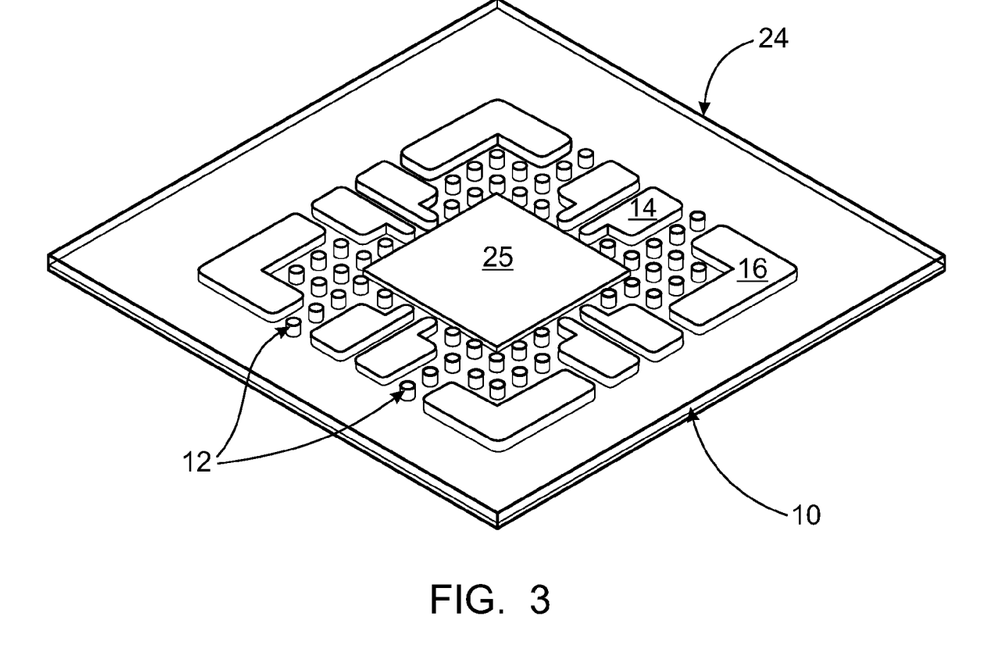
FIG. 3 shows some embodiments of a method for making semiconductor packages containing a pre-molding layer.

As shown in FIG. 3, a pre-molding layer 24 can then be provided on the lead frame 10 so that the upper surface of the vias 12 and the pads 14/16 are exposed. The pre-molding layer 24 can be made of any material known in the art, such as an epoxy molding compound, a thermoset resin, a thermoplastic material, or a potting material. The pre-molding layer 24 can be provided in any manner known in the art. In some embodiments, such as where the pre-molding layer is made of potting material, it is deposited on the lead frame 10 by dispensing and then planarizing by any physical action until the upper surfaces of the vias and the pads are exposed.

Figure 4:
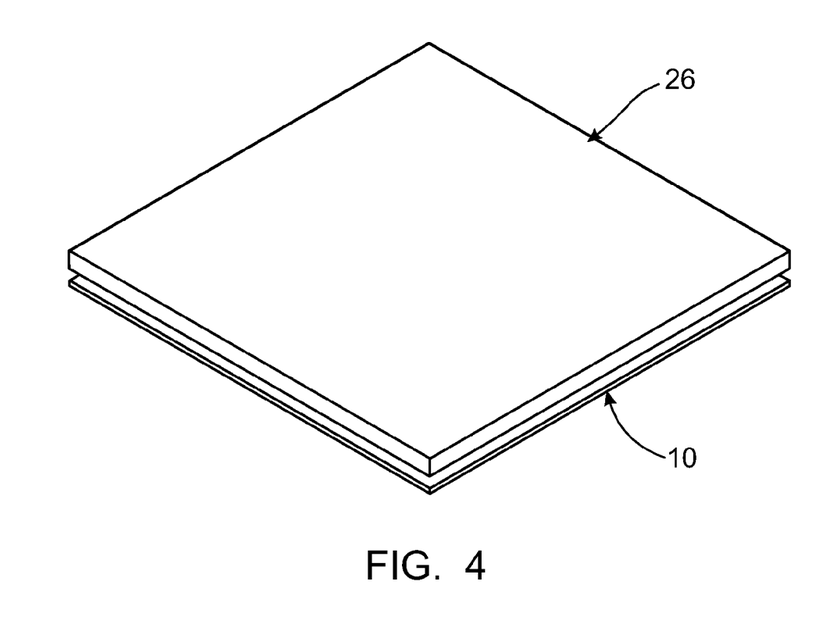
FIG. 4 depicts some embodiments of a method for making semiconductor packages containing a metal cladding layer.

As shown in FIG. 4, a metal cladding layer 26 can then be provided on the pre-molding layer 24 and the upper surfaces of the vias and the pads. In some embodiments, the metal cladding layer 26 can have any piece of metal that can be configured with the desired size and then placed using any known method, such as welding or bonding, on the pre-molding layer 24 and the upper surfaces of the vias and the pads. The metal cladding layer 26 can comprise any conductive metal or metal alloy known in the art, including Cu, Ni—Pd, Ni—Pd—Au, Fe, Ni—Pd—Au/Ag, or combinations thereof. In some embodiments, the metal cladding layer comprises Cu. The metal cladding layer 26 can have any size and thickness that will substantially match the size of the leadframe. In some embodiments, the metal cladding layer can be substantially rectangular with a thickness ranging from about 75 to about 250 μm.

In other embodiments, the structure containing the metal cladding layer depicted in FIG. 4 can be formed using another method. In these embodiments, the metal cladding layer 26 is first provided on the vias 12 and the pads 14/16 by welding or bonding. Then, the pre-molding layer 24 is provided in the empty spaces between the lead frame 10, vias 12, the pads, and the metal cladding layer 26 by transfer molding.

Figure 10:
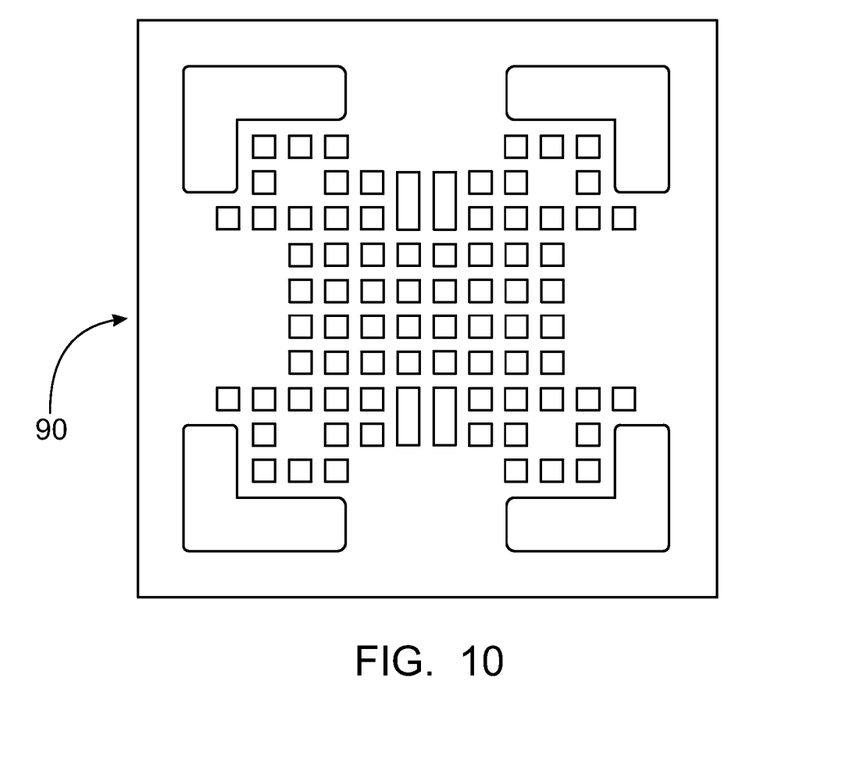
FIG. 10 depicts a bottom view of some embodiments of a semiconductor package containing a land pattern.

With the pre-molding layer 24 providing a structural stability and rigidity to the structure, the metal cladding layer 26 and optionally the leadframe 10 are then etched. The lead frame 10 and metal cladding layer 26 can be etched in the same process or in separate processes. The result of this etching of the leadframe includes the formation of lands having an array that is configured for the external electronic device to which the semiconductor package will be attached (such as a printed circuit board), as shown in FIG. 10. In some embodiments, the leadframe 10 is etched to form the lands at a later stage in the manufacturing process.

Figure 5:
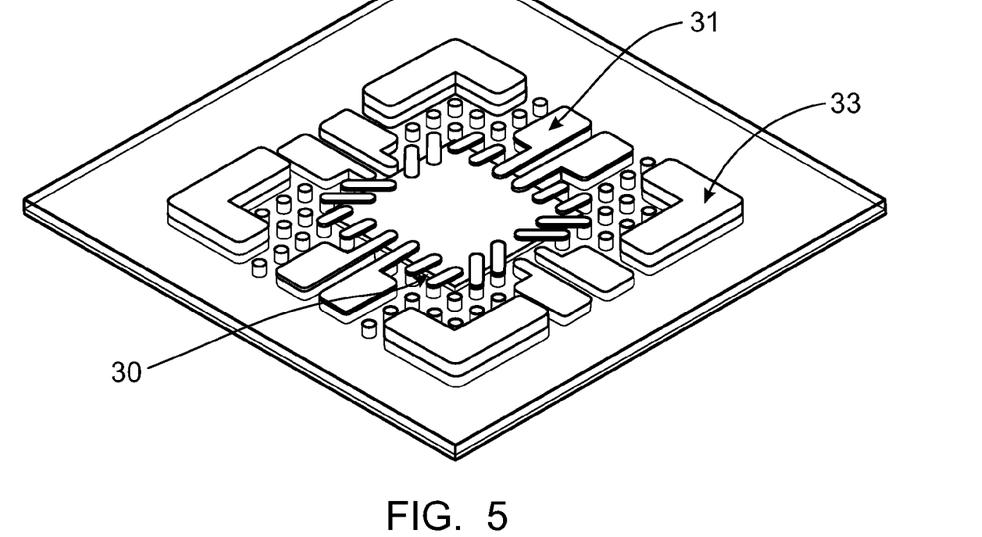
FIG. 5 shows some embodiments of a method for making semiconductor packages containing an interconnect structure of routing leads.

The metal cladding layer 26 can be etched using any known chemical etching process, such as a photomask etching or mechanical-mask etching process. The result of the etching process includes the formation of an interconnect structure containing routing leads 30 which run from the vias 12 to the backside of the first die 25. As shown in FIG. 5, the leads 30 run from the perimeter of the semiconductor package towards the interior of the semiconductor package. The leads 30 can be configured or customized to substantially match the desired connection points in the second semiconductor die that will be located thereon in the completed semiconductor package. Thus, for the semiconductor package that contains a high pin integrated circuit as illustrated in the Figures, the leads 30 are configured as a combination of lines. Of course, other shapes can be used for the leads 30 including substantially rectangular, circular, or any other known geometrical shapes. The etching process will also form routing leads 31 with protrusions extending over the first die 25 and a metal layer 33 overlying the thermal pads 16.

Figure 6:
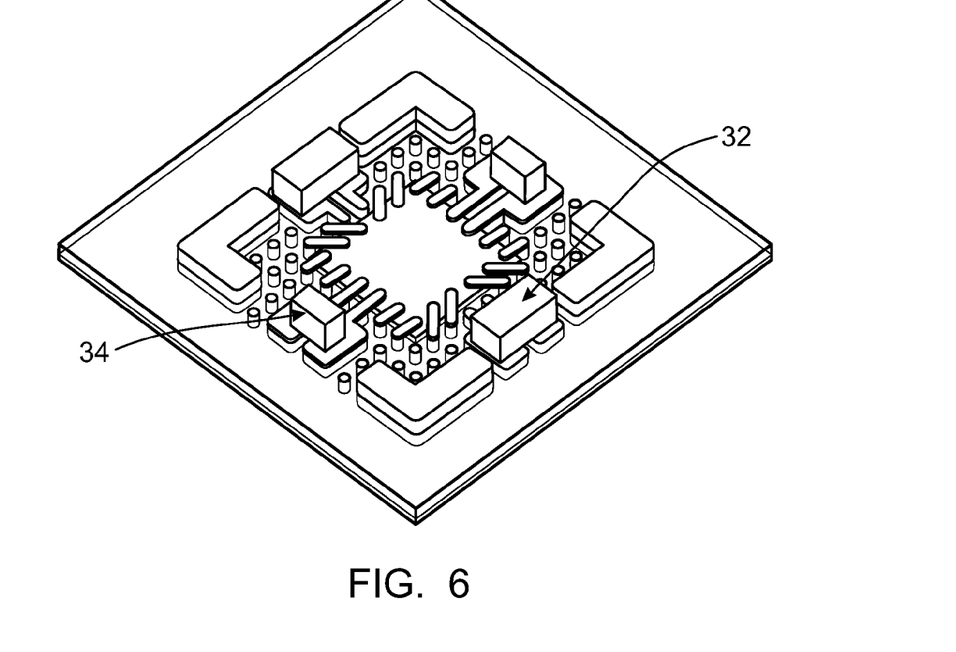
FIG. 6 shows some embodiments of a method for making semiconductor packages containing discrete devices and passive devices.

Next, as shown in FIG. 6, a discrete device and/or a passive device are then provided on the device pads 14. The discrete device and/or a passive device can be provided on the device pads 14 using any process known in the art, such as pick and place process or by using a chip shooter machine.

The semiconductor package can contain either a single discrete device 34 or multiple discrete devices 34. Any discrete device known in the art can be used in the semiconductor package, including diodes, and/or transistors. Examples of the discrete devices include zener diodes, schottky diodes, small signal diodes, bipolar junction transistors ("BJT"), metal-oxide-semiconductor field-effect transistors ("MOSFET"), insulated-gate-bipolar transistors ("IGBT"), insulated-gate field-effect transistors ("IGFET"), or combinations thereof. In some embodiments, the discrete device 34 comprises a schottky diode and bipolar transistor for audio power application. In FIG. 6, the discrete device 34 is illustrated in the form of a surface mount package, but discrete devices in chip form can also be used.

The semiconductor package can also contain either a single passive device 32 or multiple passive device 32. Any passive device known in the art can be used in the semiconductor package, including capacitors, inductors, resistors, filters, or combinations thereof. In some embodiments, the passive device 32 comprises a capacitor and resistor for audio amplifier application. In FIG. 6, the passive device 32 is illustrated in the form of a surface mount package, but passive components in chip form can also be used.

Figure 7:
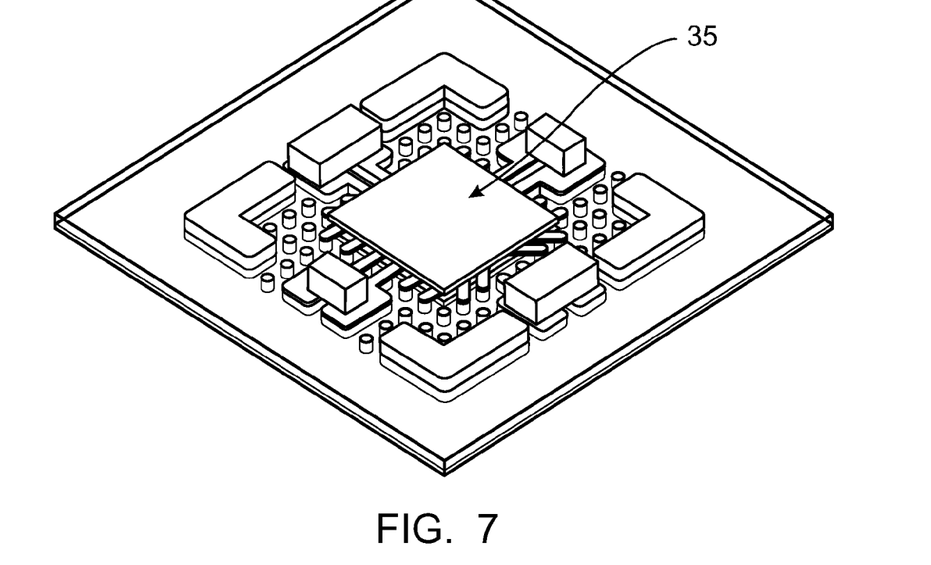
FIG. 7 depicts some embodiments of a method for making semiconductor packages containing a second semiconductor die.

Next, as shown in FIG. 7, a second semiconductor die (or IC die) 35 is attached to the routing leads 30/31. The second die 35 may be made of the same or different materials than those used in the first die. The second die 35 can contain any number of IC devices that may be the same or different than the device(s) used in the first die 25.

The second semiconductor die 35 can be attached to the routing leads 30/31 using any known flipchip process. Accordingly, similar to the first semiconductor die, bond pads are formed on the desired locations of the IC die(s) and solderable bumps are applied to the bonds pads. The die 35 is then flipped and attached so that the bumps are attached to the desired locations of the routing leads 30/31. Optionally, an adhesive can then be attached to the backside of the second semiconductor die 35.

A third semiconductor die 45 is then attached to the backside of the second semiconductor die. The third semiconductor die 45 contains any IC device(s) described herein. The third die 45 can be mounted to the backside of the second semiconductor die 35, thereby leaving the IC devices on the third die 45 exposed.

Figure 8:
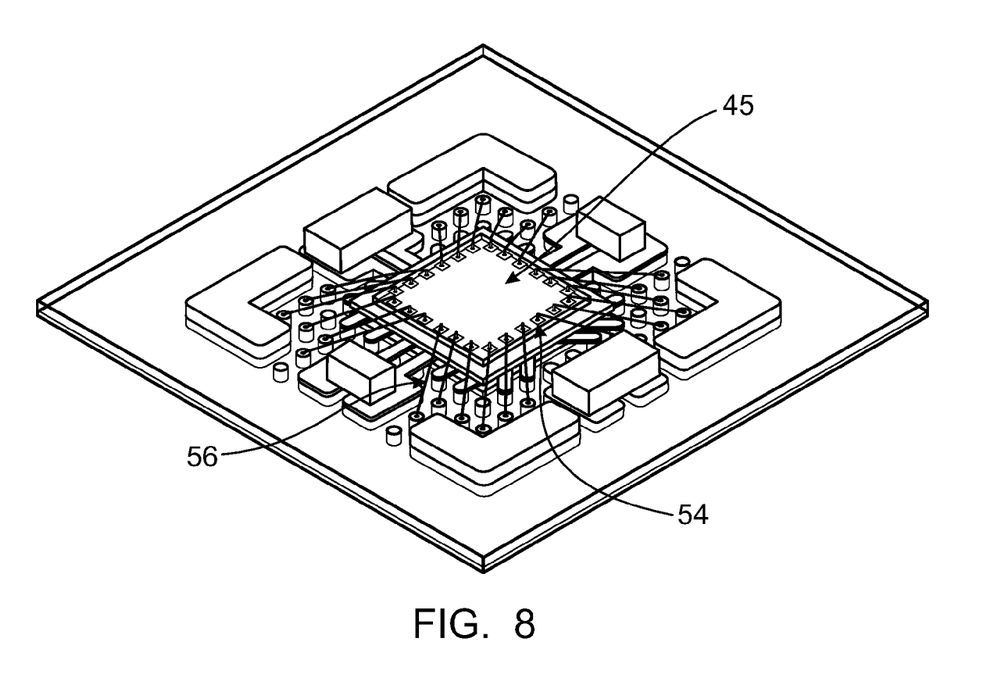
FIG. 8 shows some embodiments of a method for making semiconductor packages showing a third semiconductor die and wirebonds.

The third die 45 can also comprise contact pads 54 available for electrical connection. Typically, those contact pads 54 are located in the periphery of the third die 45, as illustrated in FIG. 8. Those contact pads 54 can then be electrically connected to one or more of the vias 12 in any known manner, such as any known wire bonding process. In such instances, the bonding wire 56 may be made of any wire bonding material and have any suitable size. Some non-limiting examples of wire bonding materials may include Au, Cu, and combinations thereof other. Where Au is used, the bonding wire may have a diameter from about 18 micrometers to about 50 micrometers. In some embodiment, the wirebonds can be formed using any known process, including those using high-frequency ultrasonic wirebonding equipment.

Figure 9:
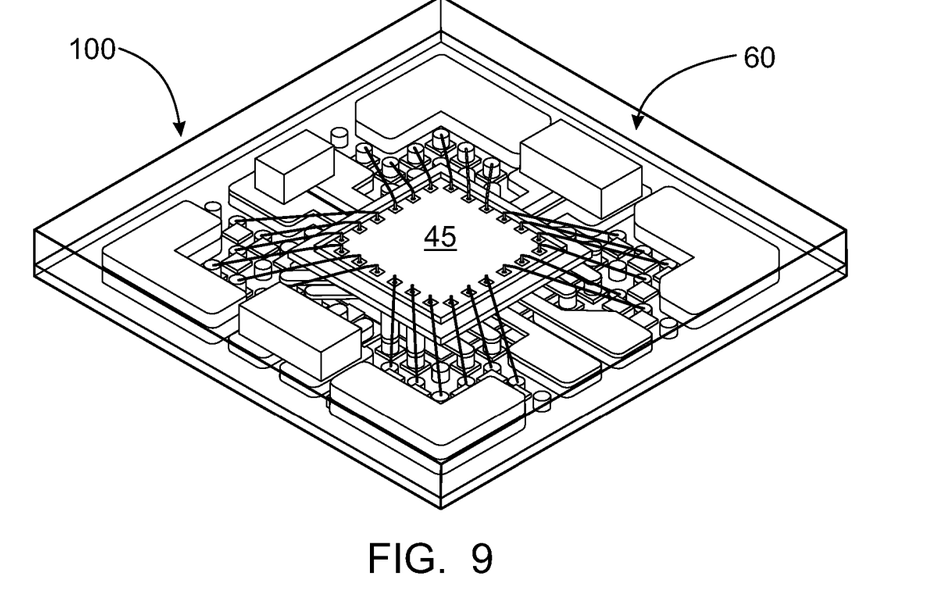
FIG. 9 depicts some embodiments of a method for making semiconductor packages showing a singulated package.

An encapsulation process is then performed on the resulting structure. The encapsulation process uses any molding material known in the art. In some embodiments, the pg,13 molding material can comprise an epoxy molding compound, a thermoset resin, a thermoplastic material, or potting material. In other embodiments, the molding material comprises an epoxy molding compound. In FIG. 9, the molding material 60 is shown in phantom to better illustrate the internal components of semiconductor package. The molding material 60 does not encapsulate the components already encapsulated by the pre-molding layer 24. The molding material 60, however, can cooperate with the pre-molding layer 24 to encapsulate the desired components of the semiconductor package except for the land pad array.

After molding, the resulting structure can be singulated into individual semiconductor packages 100. The singulation can be carried out using any process known in the art, including a saw singulation process. The semiconductor package 100, as shown in FIG. 9, can then be marked, taped, and reeled using any process known in the art.

If the leadframe 10 has not been etched yet, it is then etched to form the array of land pads 90 (or lands). The land pads (or lands) can have any configuration known in the art consistent with their operation as terminals for the semiconductor package. Thus, in the illustrated embodiments, the lands are given a substantially rectangular configuration with a width and length of about 0.30 mm$^2$. In other embodiments, though, lands can have a round or other suitable geometrical shape in application and a width and length ranging from about 0.30 mm to about 0.50 mm.

Any etching process known in the art can be used to form the land pad array, including a photomask etching or mechanical mask etching process. One example of one land pad array is depicted in FIG. 10 which shows a bottom view of the semiconductor package 100. In some embodiments, the configuration of the land pads is the combination of vias 12, device pads 14, and thermal pads 16. The land pad array can be routed and customized for a wide variety of configurations. This allows the semiconductor package to be configured with many different sizes and shapes that can accommodate different sizes of dies and different IC devices contained in the dies.

Figure 11:
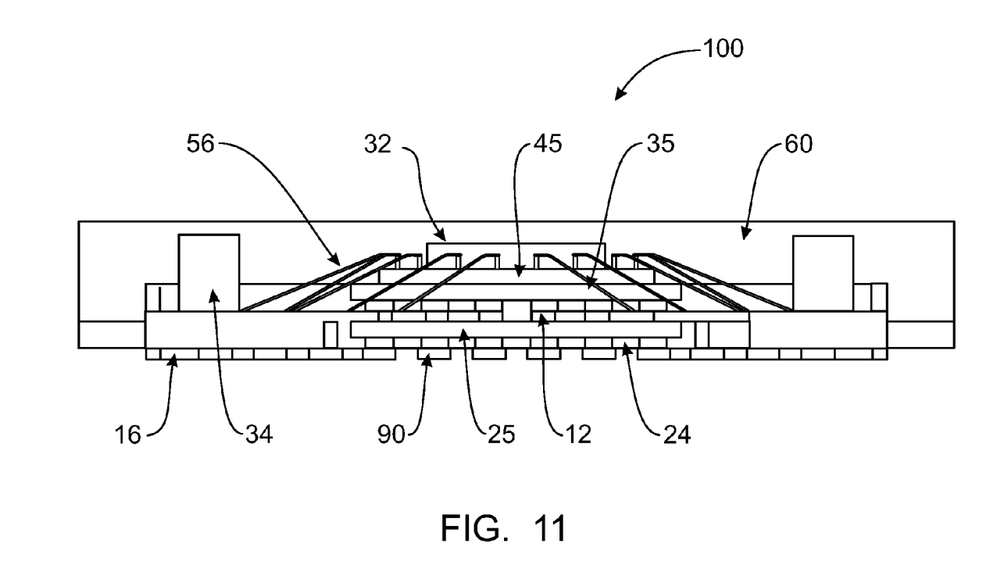
FIG. 11 depicts a cross sectional side view of some embodiments of a semiconductor package showing a singulated package.

The completed semiconductor package 100 is shown in the side view of FIG. 11. The package 100 contains both the pre-molding layer 24 and the molding material 60 that together encapsulate the package 100. The lands 90 remain exposed and are configured in a stand-off position so that they can be attached to the PCB or other external device. The lands operate to connect the first die 25 to the PCB, the device pads 14 serve to connect the discrete/passive device(s) to the PCB. The routing leads 30/31 serve to connect the second die 35 to the PCB, and the bond wires 56 operate to route the electrical signals from the IC device in the third die 45 to the PCB.

The semiconductor packages described herein have several features. These packages have a system-in-package design containing multiple semiconductor dies. The packages are also relatively thin with a thickness ranging from about 0.5 mm to about 1 mm while also have the capability of a full land pad array. The metal layering provided by the leadframe and metal cladding layer provide a high degree of routing flexibility, providing an optimal bonding layout, and are able to avoid long bond wire lengths through optimized routing. The packages have a high degree of heat dissipation because of the thermal pads and the device pads. The packages have a higher input/output (I/O) capability with a smaller package size when compared to conventional semiconductor packages. The actual package density will depend on the dies used in the package and the package body size.

In addition to any previously indicated modification, numerous other variations and alternative arrangements may be devised by those skilled in the art without departing from the spirit and scope of this description, and appended claims are intended to cover such modifications and arrangements. Thus, while the information has been described above with particularity and detail in connection with what is presently deemed to be the most practical and preferred aspects, it will be apparent to those of ordinary skill in the art that numerous modifications, including, but not limited to, form, function, manner of operation and use may be made without departing from the principles and concepts set forth herein. Also, as used herein, examples are meant to be illustrative only and should not be construed to be limiting in any manner.

The invention claimed is:

1. A semiconductor package, comprising:
a land pad array comprising a middle portion and an outer portion;
a first die containing an integrated circuit device resting on the middle portion of the land pad array;
a second die containing an integrated circuit device disposed over the first die and resting on routing leads that are connected to the outer portion of the land pad array;
a third die containing an integrated circuit device disposed on the backside of the second die, the third die electrically connected to the outer portion of the land array by wire bonds;
a passive device or a discrete device resting on an outer portion of the land pad array; and
a molding material.

2. The semiconductor package of claim 1, wherein the land pad array is formed by etching a lead frame and can be used for different package sizes.

3. The semiconductor package of claim 1, wherein the array of land pads comprise thermal pads for dissipating heat.

4. The semiconductor package of claim 1, wherein the passive device or the discrete device rest on device pads that are part of the outer portion of the land pad array.

5. The semiconductor package of claim 1, wherein the lands of the land pad array are not physically connected to each other.

6. The semiconductor package of claim 1, wherein the molding material comprises a first portion partially encapsulating the land pad array and the first die and a second portion encapsulating the routing leads, the second die, the third die, the wire bonds, and the passive or discrete device.

7. The semiconductor package of claim 6, wherein the first portion of the molding material and the second portion of the molding material are formed separately.

8. The semiconductor package of claim 1, wherein the routing leads are formed by etching a metal cladding layer.

9. A semiconductor system-in-package, comprising:
a land pad array comprising a middle portion and an outer portion;
a first die containing an integrated circuit device resting on the middle portion of the land pad array;
a second die containing an integrated circuit device disposed over the first die and resting on routing leads that are connected to the outer portion of the land pad array;
a third die containing an integrated circuit device disposed on the backside of the second die, the third die electrically connected to the outer portion of the land array by wire bonds;
a passive device or a discrete device resting on an outer portion of the land pad array; and
a molding material comprising a first portion partially encapsulating the land pad array and the first die and a second portion encapsulating the routing leads, the second die, the third die, the wire bonds, and the passive or discrete device.

10. The semiconductor package of claim 9, wherein the array of land pads comprise thermal pads for dissipating heat.

11. The semiconductor package of claim 9, wherein the passive device or the discrete device rest on device pads that are part of the outer portion of the land pad array.

12. The semiconductor package of claim 9, wherein the lands of the land pad array are not physically connected to each other.

13. The semiconductor package of claim 9, wherein the first portion of the molding material and the second portion of the molding material are formed separately.

14. An electronic device, comprising:
a semiconductor package comprising:
a land pad array comprising a middle portion and an outer portion;
a first die containing an integrated circuit device resting on the middle portion of the land pad array;
a second die containing an integrated circuit device disposed over the first die and resting on routing leads that are connected to the outer portion of the land pad array;
a third die containing an integrated circuit device disposed on the backside of the second die, the third die electrically connected to the outer portion of the land array by wire bonds;

a passive device or a discrete device resting on an outer portion of the land pad array, and a molding material; and a printed circuit board connected to the land pad array.

15. The device of claim 14, wherein the array of land pads comprise thermal pads for dissipating heat.

16. The device of claim 14, wherein the passive device or the discrete device rest on device pads that are part of the outer portion of the land pad array.

17. The device of claim 14, wherein the lands of the land pad array are not physically connected to each other.

18. The device of claim 14, wherein the molding material comprises a first portion partially encapsulating the land pad array and the first die and a second portion encapsulating the routing leads, the second die, the third die, the wire bonds, and the passive or discrete device.

19. The device of claim 18, wherein the first portion of the molding material and the second portion of the molding material are formed separately.

20. A method for making semiconductor package, comprising:
   providing a lead frame containing an array of vias, device pads, and thermal pads;
   attaching a first die containing an integrated circuit device to a die attach pad of the leadframe;
   providing a first molding material around the array of vias, device pads, thermal pads, and the first die to leave the upper surfaces of the array of vias, device pads, thermal pads exposed;
   providing routing leads from the vias and the device pads to the backside of the first die;
   attaching a passive device or a discrete device to the device pads; and
   attaching a second die containing an integrated circuit device to the routing leads;
   attaching a third die containing an integrated circuit to the backside of the second die;
   connecting the third die to the vias and the device pads by wire bonds;
   providing a second molding material to encapsulate the routing leads, the second die, the third die, the wire bonds, and the passive or discrete device; and
   etching the lead frame to form a land pad array.

21. The method of claim 20, wherein the device pads the thermal pads are located in the periphery of the leadframe.

22. The method of claim 20, wherein the lands of the land pad array are not physically connected to each other.

23. The method of claim 20, including attaching the first die by a flipchip process.

24. The method of claim 20, including attaching the second die by a flipchip process.

25. The method of claim 20, including forming the routing leads by providing a metal cladding layer on the exposed upper surfaces of the array of vias, device pads, and thermal pads and then etching the metal cladding layer.

* * * * *